US012658860B2

(12) United States Patent
Scott et al.

(10) Patent No.: US 12,658,860 B2
(45) Date of Patent: Jun. 16, 2026

(54) ANALOG PREDISTORTION (APD) FOR POWER AMPLIFIER

(71) Applicant: Qorvo US, Inc., Greensboro, NC (US)

(72) Inventors: Baker Scott, San Jose, CA (US); George Maxim, Saratoga, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 463 days.

(21) Appl. No.: 18/209,529

(22) Filed: Jun. 14, 2023

(65) Prior Publication Data

US 2023/0421112 A1 Dec. 28, 2023

Related U.S. Application Data

(60) Provisional application No. 63/356,240, filed on Jun. 28, 2022.

(51) Int. Cl.
| | |
|---|---|
| *H03F 1/32* | (2006.01) |
| *H03F 3/24* | (2006.01) |
| *H04B 1/04* | (2006.01) |

(52) U.S. Cl.
CPC ......... *H03F 1/3282* (2013.01); *H04B 1/0475* (2013.01); *H03F 3/245* (2013.01); *H04B 2001/0425* (2013.01)

(58) Field of Classification Search
None
See application file for complete search history.

(56) References Cited

U.S. PATENT DOCUMENTS

| | | |
|---|---|---|
| 4,797,898 A | 1/1989 | Martinez |
| 5,793,821 A | 8/1998 | Norrell et al. |
| (Continued) | | |

FOREIGN PATENT DOCUMENTS

| | | |
|---|---|---|
| BR | 112015001348 A2 | 7/2017 |
| CN | 1151229 A | 6/1997 |
| (Continued) | | |

OTHER PUBLICATIONS

Advisory Action U.S. Appl. No. 17/689,232, mailed May 23, 2024, 3 pages.

(Continued)

*Primary Examiner* — Andrea Lindgren Baltzell
*Assistant Examiner* — Malane Lieng
(74) *Attorney, Agent, or Firm* — Withrow & Terranova, P.L.L.C.

(57) ABSTRACT

Systems and methods for analog predistortion (APD) in power amplifiers are disclosed. In one aspect, APD may be provided in a front-end module (FEM) of a transmitter. More specifically, the APD may include different predistortions based on where within a frequency band the signal to be distorted is operating (i.e., sub-band APD). The APD in the FEM may further be based on operating conditions such as temperature within the FEM. Still further, the FEM may be configured to apply different APD based on whether or not a baseband processor (BBP) applies digital predistortion (DPD). At a minimum, the provision of the APD may make the operation of a power amplifier in FEM more linear. Further, where DPD is present, the use of the APD may simplify the requirements for the DPD provided in the BBP.

19 Claims, 9 Drawing Sheets

(56) References Cited

U.S. PATENT DOCUMENTS

| | | | |
|---|---|---|---|
| 6,166,601 | A | 12/2000 | Shalom et al. |
| 6,275,685 | B1 | 8/2001 | Wessel et al. |
| 6,630,862 | B1 | 10/2003 | Perthold et al. |
| 6,760,451 | B1 | 7/2004 | Craven et al. |
| 6,806,767 | B2 | 10/2004 | Dow |
| 6,947,711 | B1 | 9/2005 | Leyonhjelm |
| 7,076,225 | B2 | 7/2006 | Li et al. |
| 7,170,342 | B2 | 1/2007 | Suzuki et al. |
| 7,430,248 | B2 | 9/2008 | McCallister |
| 7,522,658 | B2 | 4/2009 | Jensen |
| 7,583,754 | B2 | 9/2009 | Liu |
| 7,590,190 | B2 | 9/2009 | Luke et al. |
| 7,663,436 | B2 | 2/2010 | Takano et al. |
| 7,683,713 | B2 | 3/2010 | Hongo |
| 7,738,593 | B2 | 6/2010 | Howard |
| 7,755,429 | B2 | 7/2010 | Nguyen et al. |
| 7,831,221 | B2 | 11/2010 | Leffel et al. |
| 7,859,338 | B2 | 12/2010 | Bajdechi et al. |
| 7,889,820 | B2 | 2/2011 | Murthy et al. |
| 7,978,009 | B2 | 7/2011 | Mu |
| 8,493,141 | B2 | 7/2013 | Khlat et al. |
| 8,605,819 | B2 | 12/2013 | Lozhkin |
| 8,639,199 | B1 | 1/2014 | Premakanthan et al. |
| 8,649,745 | B2 | 2/2014 | Bai et al. |
| 8,718,579 | B2 | 5/2014 | Drogi |
| 8,749,309 | B2 | 6/2014 | Ho et al. |
| 8,831,544 | B2 | 9/2014 | Walker et al. |
| 8,884,692 | B2 | 11/2014 | Lee |
| 9,001,947 | B2 | 4/2015 | Wyville |
| 9,036,734 | B1 | 5/2015 | Mauer et al. |
| 9,065,504 | B2 | 6/2015 | Kwon et al. |
| 9,112,413 | B2 | 8/2015 | Barth et al. |
| 9,356,760 | B2 | 5/2016 | Larsson et al. |
| 9,438,186 | B2 | 9/2016 | Srinidhi Embar et al. |
| 9,438,196 | B2 | 9/2016 | Smith et al. |
| 9,461,596 | B1 | 10/2016 | Ozard |
| 9,560,595 | B2 | 1/2017 | Dakshinamurthy et al. |
| 9,692,366 | B2 | 6/2017 | Pilgram |
| 9,705,477 | B2 | 7/2017 | Velazquez |
| 9,853,603 | B2 | 12/2017 | Wang |
| 9,945,901 | B1 | 4/2018 | Otte |
| 9,973,370 | B1 | 5/2018 | Langer et al. |
| 10,128,798 | B2 | 11/2018 | Duncan et al. |
| 10,177,719 | B2 | 1/2019 | Gazneli et al. |
| 10,181,478 | B2 | 1/2019 | Scott et al. |
| 10,305,435 | B1 | 5/2019 | Murugesu et al. |
| 10,326,408 | B2 | 6/2019 | Khlat et al. |
| 10,361,744 | B1 | 7/2019 | Khlat |
| 10,432,145 | B2 | 10/2019 | Khlat |
| 10,476,437 | B2 | 11/2019 | Nag et al. |
| 10,778,345 | B2 | 9/2020 | El-Hassan et al. |
| 10,804,866 | B2 | 10/2020 | Lehtola |
| 11,005,368 | B2 | 5/2021 | Bansal et al. |
| 11,088,660 | B2 | 8/2021 | Lin et al. |
| 11,133,854 | B1 | 9/2021 | Pratt et al. |
| 11,165,393 | B2 | 11/2021 | Pehlke |
| 11,387,789 | B2 | 7/2022 | Khlat et al. |
| 11,424,719 | B2 | 8/2022 | Khlat |
| 11,483,186 | B2 | 10/2022 | Casper et al. |
| 11,569,783 | B2 | 1/2023 | Nomiyama et al. |
| 11,595,005 | B2 | 2/2023 | Balteanu et al. |
| 11,637,531 | B1 | 4/2023 | Perreault et al. |
| 2001/0022532 | A1 | 9/2001 | Dolman |
| 2001/0054974 | A1 | 12/2001 | Wright |
| 2002/0190811 | A1 | 12/2002 | Sperber |
| 2003/0042979 | A1 | 3/2003 | Gurvich et al. |
| 2004/0239446 | A1 | 12/2004 | Gurvich et al. |
| 2004/0259509 | A1 | 12/2004 | Duello et al. |
| 2005/0100105 | A1 | 5/2005 | Jensen |
| 2005/0190857 | A1 | 9/2005 | Braithwaite |
| 2005/0195030 | A1* | 9/2005 | Okazaki ........... H04B 1/62 |
| | | | 330/149 |
| 2005/0254659 | A1 | 11/2005 | Heinsen |
| 2005/0258898 | A1 | 11/2005 | Hongo |
| 2006/0068710 | A1 | 3/2006 | Jensen |
| 2006/0209981 | A1 | 9/2006 | Kluesing et al. |
| 2006/0217083 | A1 | 9/2006 | Braithwaite |
| 2007/0032208 | A1 | 2/2007 | Choi et al. |
| 2007/0164818 | A1 | 7/2007 | Horiguchi et al. |
| 2007/0190952 | A1* | 8/2007 | Waheed .............. H03F 1/3241 |
| | | | 455/114.3 |
| 2008/0009258 | A1 | 1/2008 | Safarian et al. |
| 2008/0074209 | A1 | 3/2008 | Ceylan et al. |
| 2008/0161073 | A1 | 7/2008 | Park et al. |
| 2008/0246550 | A1 | 10/2008 | Biedka et al. |
| 2009/0004981 | A1 | 1/2009 | Eliezer et al. |
| 2009/0061787 | A1 | 3/2009 | Koller et al. |
| 2009/0074106 | A1 | 3/2009 | See et al. |
| 2009/0125264 | A1 | 5/2009 | Betts et al. |
| 2009/0141828 | A1 | 6/2009 | Huang et al. |
| 2009/0141830 | A1 | 6/2009 | Ye |
| 2009/0232260 | A1 | 9/2009 | Hayashi et al. |
| 2009/0302945 | A1 | 12/2009 | Catoiu et al. |
| 2010/0135439 | A1 | 6/2010 | Lackey |
| 2010/0298030 | A1 | 11/2010 | Howard |
| 2011/0095826 | A1 | 4/2011 | Hadjichristos et al. |
| 2011/0182347 | A1 | 7/2011 | Cheung |
| 2011/0227767 | A1 | 9/2011 | O'Brien |
| 2012/0068748 | A1 | 3/2012 | Stojanovic et al. |
| 2012/0139635 | A1 | 6/2012 | Ho et al. |
| 2012/0189081 | A1 | 7/2012 | Omoto et al. |
| 2012/0244824 | A1 | 9/2012 | Entezari et al. |
| 2012/0256688 | A1 | 10/2012 | Onishi |
| 2013/0141062 | A1 | 6/2013 | Khlat |
| 2013/0214858 | A1 | 8/2013 | Tournatory et al. |
| 2013/0222057 | A1 | 8/2013 | Henshaw |
| 2013/0243129 | A1 | 9/2013 | Okuni et al. |
| 2014/0028368 | A1 | 1/2014 | Khlat |
| 2014/0029683 | A1 | 1/2014 | Morris et al. |
| 2014/0055199 | A1 | 2/2014 | Takano et al. |
| 2014/0062590 | A1 | 3/2014 | Khlat et al. |
| 2014/0062599 | A1 | 3/2014 | Xu et al. |
| 2014/0065989 | A1 | 3/2014 | McLaurin |
| 2014/0072307 | A1 | 3/2014 | Zamani et al. |
| 2014/0084996 | A1 | 3/2014 | Schwent et al. |
| 2014/0105264 | A1 | 4/2014 | McLaurin et al. |
| 2014/0141730 | A1 | 5/2014 | Damavandi et al. |
| 2014/0184337 | A1 | 7/2014 | Nobbe et al. |
| 2014/0213196 | A1 | 7/2014 | Langer et al. |
| 2014/0232470 | A1 | 8/2014 | Wilson |
| 2014/0266432 | A1 | 9/2014 | Scott et al. |
| 2014/0315504 | A1 | 10/2014 | Sakai et al. |
| 2014/0361837 | A1 | 12/2014 | Strange et al. |
| 2015/0028946 | A1 | 1/2015 | Al-Qaq et al. |
| 2015/0126142 | A1 | 5/2015 | Meredith |
| 2015/0333781 | A1 | 11/2015 | Alon et al. |
| 2016/0173030 | A1 | 6/2016 | Langer et al. |
| 2016/0174293 | A1 | 6/2016 | Mow et al. |
| 2016/0182099 | A1 | 6/2016 | Boddupally et al. |
| 2016/0182100 | A1 | 6/2016 | Menkhoff et al. |
| 2016/0269210 | A1 | 9/2016 | Kim et al. |
| 2016/0301432 | A1 | 10/2016 | Shizawa et al. |
| 2016/0322992 | A1 | 11/2016 | Okawa et al. |
| 2017/0005676 | A1 | 1/2017 | Yan et al. |
| 2017/0104502 | A1 | 4/2017 | Pratt |
| 2017/0149457 | A1 | 5/2017 | Mayer et al. |
| 2017/0170838 | A1 | 6/2017 | Pagnanelli |
| 2017/0230924 | A1 | 8/2017 | Wolberg et al. |
| 2017/0338842 | A1 | 11/2017 | Pratt |
| 2017/0353197 | A1 | 12/2017 | Ruffieux et al. |
| 2018/0034418 | A1 | 2/2018 | Blednov |
| 2018/0175813 | A1 | 6/2018 | Scott et al. |
| 2018/0226923 | A1 | 8/2018 | Nagamori |
| 2018/0248570 | A1 | 8/2018 | Camuffo |
| 2019/0041890 | A1 | 2/2019 | Chen et al. |
| 2019/0058530 | A1 | 2/2019 | Rainish et al. |
| 2019/0068234 | A1 | 2/2019 | Khlat et al. |
| 2019/0097671 | A1 | 3/2019 | Dimpflmaier et al. |
| 2019/0238152 | A1 | 8/2019 | Pagnanelli |
| 2019/0245496 | A1 | 8/2019 | Khlat et al. |
| 2019/0296929 | A1 | 9/2019 | Milicevic et al. |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |

(56) References Cited

U.S. PATENT DOCUMENTS

| | | | |
|---|---|---|---|
| 2020/0119699 A1 | 4/2020 | Nishihara et al. | |
| 2020/0136561 A1 | 4/2020 | Khlat et al. | |
| 2020/0136563 A1 | 4/2020 | Khlat | |
| 2020/0136568 A1 | 4/2020 | Hosoda et al. | |
| 2020/0162030 A1 | 5/2020 | Drogi et al. | |
| 2020/0204422 A1 | 6/2020 | Khlat | |
| 2020/0259685 A1 | 8/2020 | Khlat | |
| 2020/0295713 A1 | 9/2020 | Khlat | |
| 2020/0336111 A1 | 10/2020 | Khlat | |
| 2021/0058970 A1 | 2/2021 | Kwak et al. | |
| 2021/0067097 A1 | 3/2021 | Wang et al. | |
| 2021/0099136 A1 | 4/2021 | Drogi et al. | |
| 2021/0143859 A1 | 5/2021 | Hageraats et al. | |
| 2021/0194517 A1 | 6/2021 | Mirea et al. | |
| 2021/0194740 A1 | 6/2021 | Aldana et al. | |
| 2021/0281228 A1 | 9/2021 | Khlat | |
| 2021/0399690 A1 | 12/2021 | Panseri et al. | |
| 2021/0399697 A1 | 12/2021 | Cheng et al. | |
| 2022/0021348 A1 | 1/2022 | Philpott et al. | |
| 2022/0216834 A1 | 7/2022 | Myoung et al. | |
| 2022/0360229 A1 | 11/2022 | Khlat | |
| 2022/0407462 A1 | 12/2022 | Khlat | |
| 2022/0407463 A1 | 12/2022 | Khlat et al. | |
| 2022/0407464 A1 | 12/2022 | Khlat et al. | |
| 2022/0407465 A1 | 12/2022 | Khlat | |
| 2022/0407478 A1 | 12/2022 | Khlat et al. | |
| 2022/0416730 A1 | 12/2022 | Su et al. | |
| 2023/0009653 A1* | 1/2023 | Vejlgaard | H04B 17/13 |
| 2023/0065760 A1 | 3/2023 | Hellberg | |
| 2023/0079153 A1 | 3/2023 | Khlat | |
| 2023/0080621 A1 | 3/2023 | Khlat | |
| 2023/0080652 A1 | 3/2023 | Khlat et al. | |
| 2023/0081095 A1 | 3/2023 | Khlat | |
| 2023/0082145 A1 | 3/2023 | Lin et al. | |
| 2023/0140184 A1 | 5/2023 | Zhu et al. | |
| 2023/0155614 A1 | 5/2023 | Jelonnek et al. | |
| 2023/0238927 A1 | 7/2023 | Kay et al. | |
| 2023/0318537 A1 | 10/2023 | Scott et al. | |
| 2023/0344477 A1* | 10/2023 | Kovacic | H04B 7/0479 |
| 2023/0387859 A1 | 11/2023 | Drogi et al. | |
| 2023/0387860 A1 | 11/2023 | Khlat et al. | |
| 2023/0387861 A1 | 11/2023 | Maxim et al. | |
| 2023/0421110 A1 | 12/2023 | Maxim et al. | |
| 2023/0421111 A1 | 12/2023 | Khlat et al. | |
| 2023/0421120 A1 | 12/2023 | Maxim et al. | |
| 2024/0372665 A1 | 11/2024 | Khoryaev et al. | |
| 2024/0426954 A1 | 12/2024 | Guan et al. | |

FOREIGN PATENT DOCUMENTS

| | | |
|---|---|---|
| CN | 1326321 C | 12/2001 |
| CN | 1550064 A | 11/2004 |
| CN | 1706096 A | 12/2005 |
| CN | 101036289 A | 9/2007 |
| CN | 101651459 A | 2/2010 |
| CN | 105812073 A | 7/2016 |
| CN | 107483021 A | 12/2017 |
| CN | 110798155 A | 2/2020 |
| CN | 110855251 A | 2/2020 |
| CN | 111064438 A | 4/2020 |
| CN | 210693998 U | 6/2020 |
| CN | 112995079 A | 6/2021 |
| CN | 113055324 A | 6/2021 |
| CN | 113659938 A | 11/2021 |
| CN | 113055324 B | 12/2021 |
| CN | 116015223 A | 4/2023 |
| CN | 113659938 B | 5/2023 |
| CN | 116794580 A | 9/2023 |
| CN | 117134711 A | 11/2023 |
| CN | 118117977 A | 5/2024 |
| CN | 118648236 A | 9/2024 |
| CN | 118872201 A | 10/2024 |
| CN | 118117977 B | 11/2024 |
| CN | 119072847 A | 12/2024 |
| CN | 119096468 A | 12/2024 |
| EP | 2705604 A2 | 3/2014 |
| EP | 2582041 B1 | 4/2018 |
| EP | 2232713 B1 | 10/2018 |
| EP | 3416340 A1 | 12/2018 |
| JP | 2011211533 A | 10/2011 |
| JP | 2015099972 A | 5/2015 |
| KR | 20110105319 A | 9/2011 |
| KR | 101334652 B1 | 12/2013 |
| WO | 2007092794 A2 | 8/2007 |
| WO | 2010011551 A2 | 1/2010 |
| WO | 2010135711 A1 | 11/2010 |
| WO | 2012151594 A2 | 11/2012 |
| WO | 2014026178 A1 | 2/2014 |
| WO | 2021042088 A2 | 3/2021 |
| WO | 2023147211 A1 | 8/2023 |
| WO | 2023150539 A1 | 8/2023 |
| WO | 2023150545 A1 | 8/2023 |
| WO | 2023150587 A1 | 8/2023 |
| WO | 2023235070 A1 | 12/2023 |
| WO | 2023249771 A1 | 12/2023 |
| WO | 2023249889 A1 | 12/2023 |

OTHER PUBLICATIONS

Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016

(56)          References Cited

OTHER PUBLICATIONS

IEEE International Conference on Ubiquitous Wireless Broadband (ICUWB), Oct. 16-19, 2016, Nanjing, China, IEEE, 3 pages.

Extended European Search Report for European Patent Application No. 22195695.6, mailed Feb. 14, 2023, 12 pages.

Extended European Search Report for European Patent Application No. 22196188.1, mailed Feb. 2, 2023, 25 pages.

International Search Report and Written Opinion for International Patent Application No. PCT/US2023/060303, mailed Apr. 11, 2023, 12 pages.

Final Office Action for U.S. Appl. No. 17/942,472, mailed Jul. 19, 2023, 16 pages.

Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.

Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.

Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

Non-Final Office Action for U.S. Appl. No. 17/737,300, mailed Aug. 28, 2023, 14 pages.

Extended European Search Report for European Patent Application No. 23153108.8, mailed Jun. 20, 2023, 18 pages.

Hammi et al., "Temperature Compensated Digital Predistorter for 3G Power Amplifiers," Electronics, Circuit and Systems, 2005, Dec. 11, 2005, pp. 1-4.

Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.

Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.

Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.

Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.

Notice of Allowance for U.S. Appl. No. 17/689,232, mailed Oct. 21, 2024, 10 pages.

Notice of Allowance for U.S. Appl. No. 17/714,244, mailed Sep. 16, 2024, 8 pages.

Non-Final Office Action for U.S. Appl. No. 17/939,350, mailed Sep. 6, 2024, 8 pages.

Non-Final Office Action for U.S. Appl. No. 17/890,538, mailed Oct. 21, 2024, 13 pages.

Notice of Allowance and Examiner-Initiated Interview Summary for U.S. Appl. No. 17/700,826, mailed Sep. 11, 2024, 10 pages.

International Search Report and Written Opinion for International Patent Application No. PCT/US2023/060803, mailed May 19, 2023, 13 pages.

International Search Report and Written Opinion for International Patent Application No. PCT/US2023/060804, mailed May 4, 2023, 19 pages.

International Search Report and Written Opinion for International Patent Application No. PCT/US2023/025512, mailed Sep. 28, 2023, 13 pages.

Advisory Action for U.S. Appl. No. 17/942,472, mailed Sep. 15, 2023, 3 pages.

Notice of Allowance for U.S. Appl. No. 17/942,472, mailed Oct. 18, 2023, 10 pages.

International Search Report and Written Opinion for International Patent Application No. PCT/US2023/019267, mailed Aug. 3, 2023, 14 pages.

Williams, P., "Crossover Filter Shape Comparisons," White Paper, Linea Research, Jul. 2013, 13 pages.

Corrected Notice of Allowability for U.S. Appl. No. 17/942,472, mailed Nov. 17, 2023, 6 pages.

Non-Final Office Action for U.S. Appl. No. 17/939,350, mailed Jan. 17, 2024, 11 pages.

Fu, J.-S. et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.

Kim, S. et al., "A Tunable Power Amplifier Employing Digitally Controlled Accumulation-mode Varactor Array for 2.4-GHz Short-range Wireless Communication," 2016 IEEE Asia Pacific Conference on Circuits and Systems (APCCAS), Oct. 25-28, 2016, Jeju, Korea (South), IEEE, pp. 269-272.

Wang, T.-P., "A Fully Integrated W-Band Push-Push CMOS VCO With Low Phase Noise and Wide Tuning Range," IEEE Transactions on Ultrasonics, Ferroelectrics, and Frequency Control, vol. 58, No. 7, Jul. 2011, IEEE, pp. 1307-1319.

Wanner, R. et al., "Monolithically Integrated SiGe Push-Push Oscillators in the Frequency Range 50-190 GHZ," 2006 IEEE Ninth International Symposium on Spread Spectrum Techniques and Applications, Aug. 28-31, 2006, Manaus, Brazil, IEEE, pp. 26-30.

Notice of Allowance for U.S. Appl. No. 17/700,685, mailed Apr. 5, 2024, 7 pages.

Final Office Action for U.S. Appl. No. 17/689,232, mailed Mar. 26, 2024, 28 pages.

Supplemental Notice of Allowability for U.S. Appl. No. 17/700,700, mailed Feb. 28, 2024, 5 pages.

* cited by examiner

ANALOG PREDISTORTION (APD) FOR POWER AMPLIFIER

PRIORITY CLAIM

The present application claims priority to U.S. Provisional Patent Application Ser. No. 63/356,240, filed on Jun. 28, 2022, and entitled "DPD-FRIENDLY FRONT-END TX PATH FOR MULTI-MODE WITH/WITHOUT DPD AND SIMPLIFIED ANALOG WIDEBAND PRE-CALIBRA-TION," the contents of which is incorporated herein by reference in its entirety.

BACKGROUND

I. Field of the Disclosure

The technology of the disclosure relates generally to power amplifiers and, more particularly, to assisting in providing linear operation for power amplifiers over wide-band frequency ranges.

II. Background

Computing devices abound in modern society, and more particularly, mobile communication devices have become increasingly common. The prevalence of these mobile com-munication devices is driven in part by the many functions that are now enabled on such devices. Increased processing capabilities in such devices means that mobile communica-tion devices have evolved from pure communication tools into sophisticated mobile entertainment centers, thus enabling enhanced user experiences. With the advent of the myriad functions available to such devices, there has been increased pressure to improve data transmission that is used by these myriad functions. This pressure has resulted in wireless standards that operate over increasingly large fre-quency bands. Additionally, there are increasingly strict requirements controlling power levels. The combination of power level control across wide frequency bands places pressure on power amplifiers used to boost signals for transmission. This pressure provides room for innovation.

SUMMARY

Aspects disclosed in the detailed description include systems and methods for analog predistortion (APD) in power amplifiers. In an exemplary aspect, APD may be provided in a front-end module (FEM) of a transmitter. More specifically, the APD may include different predistortions based on where within a frequency band the signal to be distorted is operating (i.e., sub-band APD). The APD in the FEM may further be based on operating conditions such as temperature within the FEM. Still further, the FEM may be configured to apply different APD based on whether or not a baseband processor (BBP) applies digital predistortion (DPD). At a minimum, the provision of the APD may make the operation of a power amplifier in FEM more linear. Further, where DPD is present, the use of the APD may simplify the requirements for the DPD provided in the BBP.

In this regard, in one aspect, a FEM is disclosed. The FEM includes a power amplifier configured to receive and amplify a signal. The FEM further includes a memory comprising a look-up table (LUT) comprising sub-band APD coefficients. The FEM also includes an APD circuit coupled to the power amplifier and configured to adjust the signal to compensate for distortion in the signal based on the sub-band APD coefficients in the memory.

In another aspect, a transmitter is disclosed. The trans-mitter includes a baseband processor (BBP) and a FEM coupled to the BBP. The transmitter also includes a power amplifier configured to receive and amplify a signal received from the BBP, a memory comprising a LUT comprising sub-band APD coefficients, and an APD circuit coupled to the power amplifier and configured to adjust the signal to compensate for distortion in the signal based on the sub-band APD coefficients in the memory.

DETAILED DESCRIPTION

Figure 1:
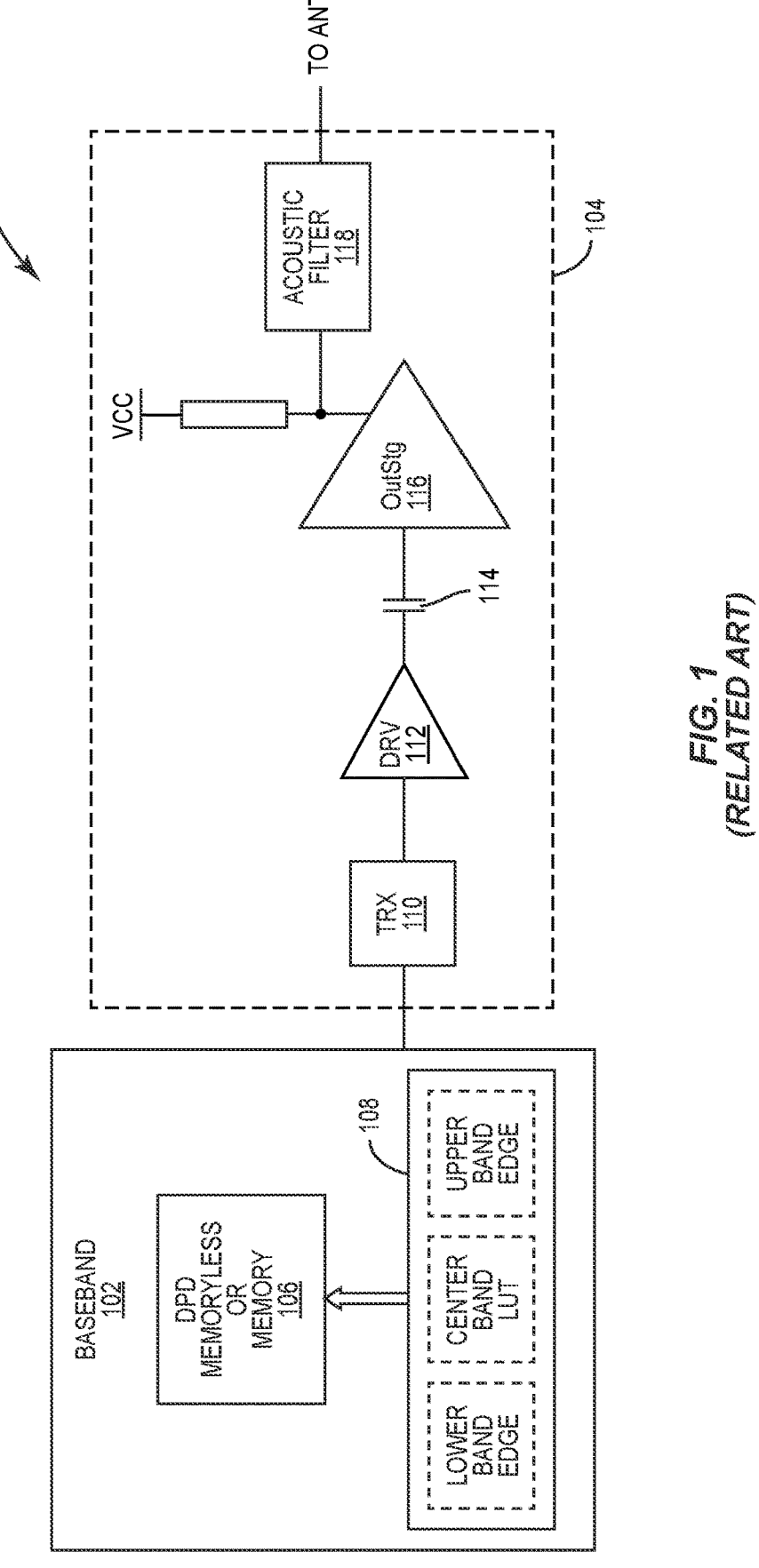
FIG. 1 is a block diagram of a conventional transmitter that relies on digital predistortion in a baseband processor (BBP)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these con-cepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, no intervening elements are present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, no intervening elements are present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include systems and methods for analog predistortion (APD) in power amplifiers. In an exemplary aspect, APD may be provided in a front-end module (FEM) of a transmitter. More specifically, the APD may include different predistortions based on where within a frequency band the signal to be distorted is operating (i.e., sub-band APD). The APD in the FEM may further be based on operating conditions such as temperature within the FEM. Still further, the FEM may be configured to apply different APDs based on whether or not a baseband processor (BBP) applies digital predistortion (DPD). At a minimum, the provision of the APD may make the operation of a power amplifier in a FEM more linear. Further, where DPD is present, the use of the APD may simplify the requirements for the DPD provided in the BBP.

Figure 2:
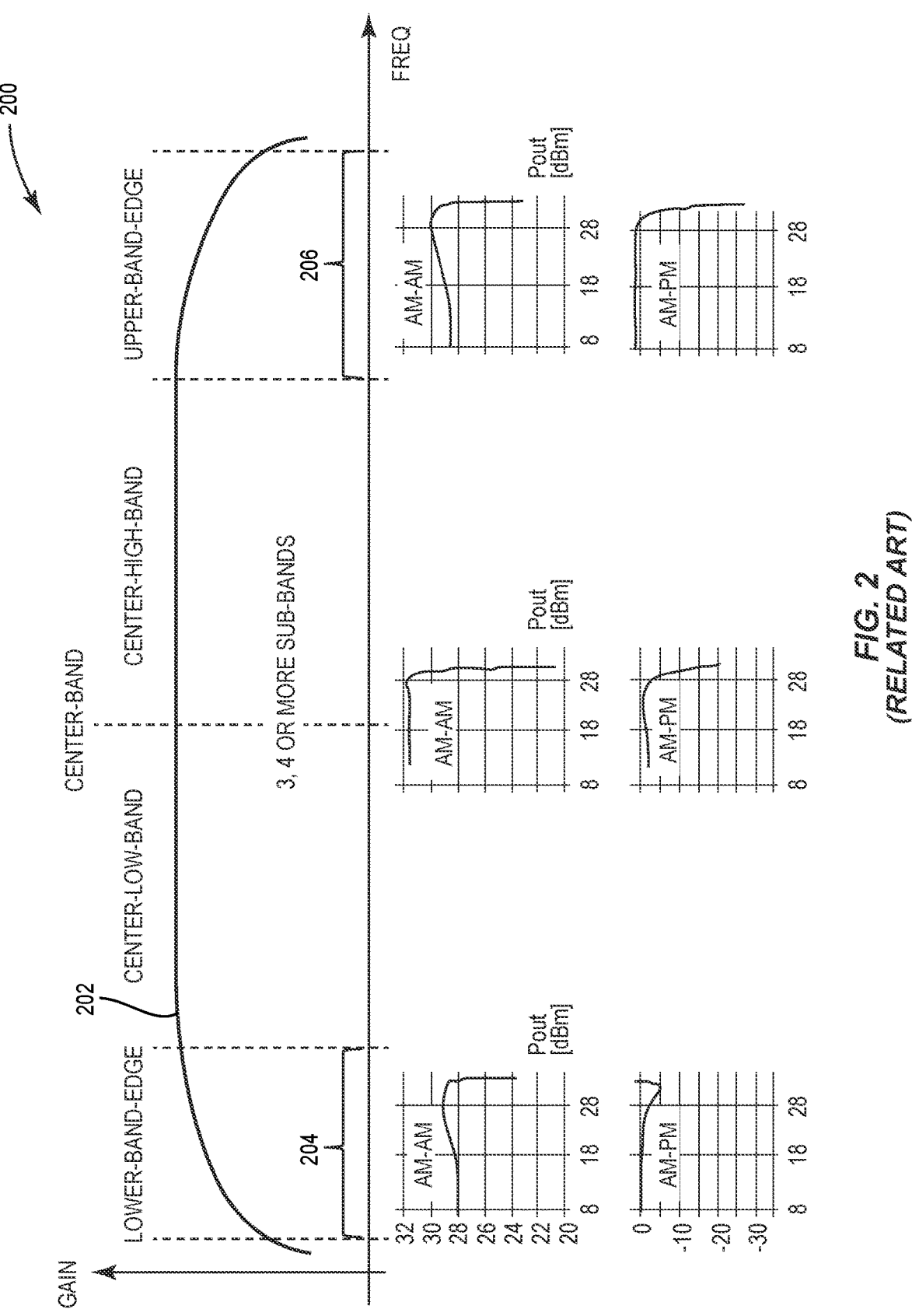
FIG. 2 is a gain versus frequency graph showing how a response for a power amplifier changes over frequency and necessitates correction for linear operation.

Before addressing aspects of the present disclosure, a brief overview of a conventional transmitter and some of the challenges for a power amplifier over a wide frequency band are discussed with respect to FIGS. 1 and 2. A discussion of exemplary aspects of the present disclosure begins below with reference to FIG. 3.

In this regard, FIG. 1 is a block diagram of a transmitter 100 having a BBP 102 and a FEM 104. The BBP 102 may include a control circuit (not shown) that operates with a DPD circuit 106 to apply DPD to signals to be transmitted. The DPD circuit 106 may use memoryless or memory-based DPD and may apply different DPD based on a sub-band of a frequency band in which the signal to be transmitted occurs. The different DPD values may be stored as coefficients in a look-up table (LUT) 108. With its DPD, the signal passes from the BBP 102 to the FEM 104. In the FEM 104, additional transmission circuitry 110 may further condition the signal before passing the signal to a driver amplifier 112. The driver amplifier 112 may boost the signal by an initial amount and create some distortion therein. The driver amplifier 112 passes the boosted signal to an output stage power amplifier 116 through a blocking capacitor 114. The output stage amplifier 116 amplifies the boosted signal to a desired transmission level and, in the process, adds distortion to the signal. The amplified signal is sent to an antenna (not shown) through a filter 118, such as an acoustic filter. The distortion created by the driver amplifier 112, the output stage amplifier 116, and possibly the filter 118 is canceled in a well-designed system by the DPD applied in the BBP 102.

The newer frequency bands in which 5G wireless operates are larger than previous bands. For example, HB B41 covers 2496-2690 MHz, while for USB B77, the frequency range is 3300-4200 MHz. Prime-tier mobile terminals will use baseband DPD to linearize the transmit path. Thus, as noted above, the BBP 102 may have DPD values for sub-bands of a frequency range stored in the LUT 108. FIG. 2 provides a more visual representation of the rationale for having these sub-bands. Specifically, FIG. 2 provides a gain versus frequency graph 200 for a power amplifier such as an output stage power amplifier 116. The gain line 202 is low in a lower-band-edge region 204 and also in an upper-band-edge region 206. These low regions are demonstrably non-linear and may require different corrections via DPD. Further, there may be different corrections for amplitude modulation-amplitude modulation (AM-AM) predistortion and amplitude modulation-phase modulation (AM-PM) corrections.

While using DPD may assist in providing linear operation, the more sub-bands present, the more DPD coefficients are required. This may impose significant memory size penalties and also makes for more complicated calibration of the different DPD coefficient sets. Alternatively, if a single DPD coefficient set is used, such an approach may introduce different distortions in some portions of the frequency band. These different distortions may be better or worse than the natural response of the power amplifier.

Exemplary aspects of the present disclosure remove some of the burdens for predistortion from the BBP by providing APD in the FEM. Providing APD in the FEM also opens up the possibility of correcting for environmental distortion, such as may occur during temperature variations. Such environmental factors may be difficult to detect in the BBP, and even if detected, correction for such conditions would geometrically increase the number of DPD coefficients with appurtenant memory penalties. As another option, non-premium tier mobile terminals having the APD in the FEM may allow for the use of a less robust BBP, which may result in cost savings.

Figure 3:
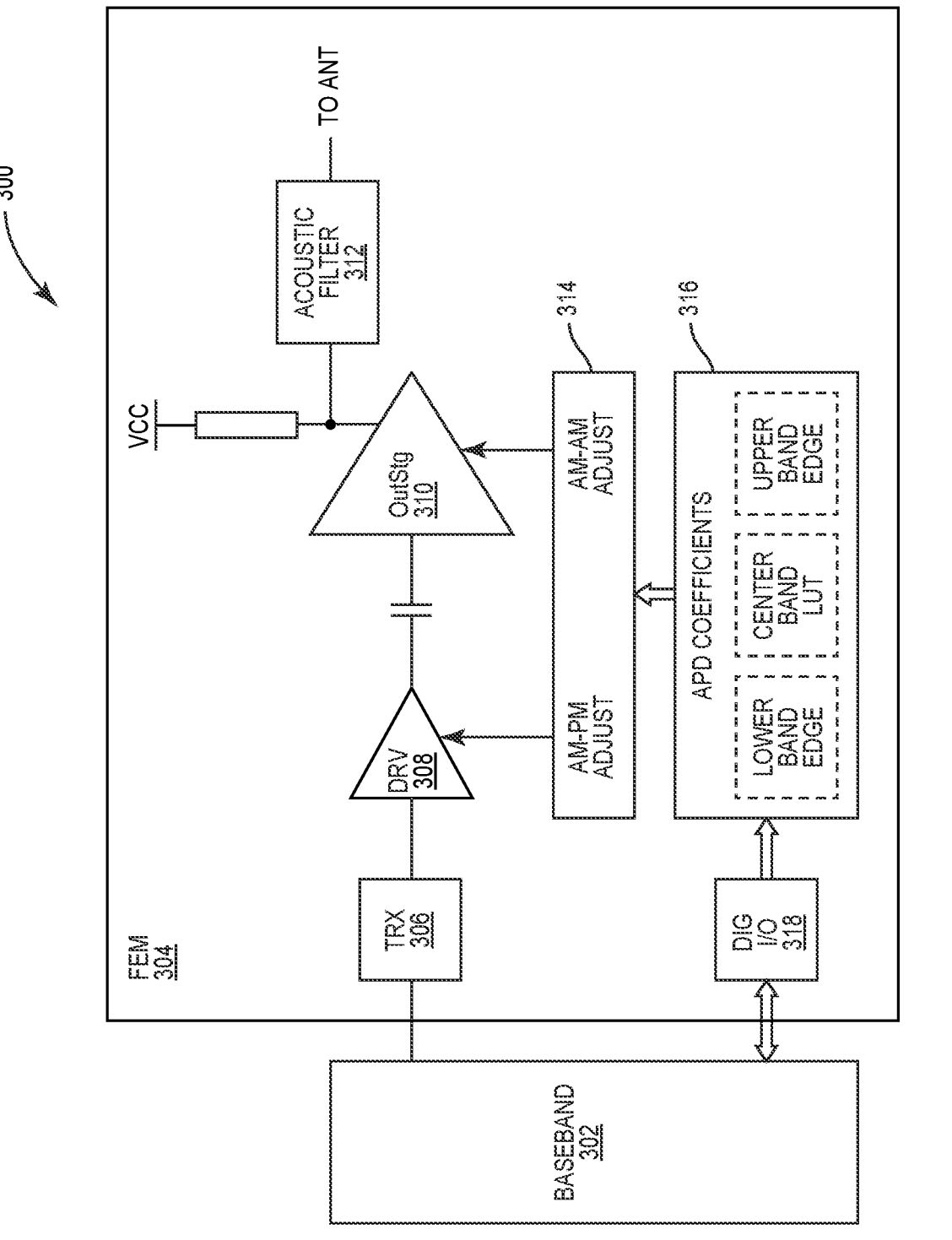
FIG. 3 is a block diagram of a transmitter with front-end analog predistortion (APD) to assist in creating a linear response from a power amplifier in the transmitter according to exemplary aspects of the present disclosure.

In this regard, FIG. 3 illustrates a transmitter 300 with a BBP 302 and a FEM 304. The FEM 304 may include transmit circuitry 306, a driver amplifier 308, and an output stage amplifier 310. The output stage amplifier 310 may be coupled to an antenna (not shown) through a filter 312. Additionally, APD circuitry 314 may be present and may provide APD adjustments to one or more elements of the FEM 304, including AM-AM adjustments and/or AM-PM adjustments. The specific adjustments may be defined by APD coefficients stored in a LUT 316 and may be based on sub-bands or the like. In an exemplary aspect, each frequency band of interest may have its own set of APD coefficients and normalize the distortion profile across all frequency bands and sub-bands to a single profile. This profile may then be used with the DPD provided by the BBP 302 (if any). In this manner, the BBP 302 only needs to store one set of DPD coefficients regardless of frequency used or frequency sub-band. Note also that there may be communication from the BBP 302 to the FEM 304 through a digital input/output interface 318. This communication may include a frequency band and sub-band information, an encoding scheme, or other information as needed or desired to facilitate in selection of the appropriate APD sub-band coefficients.

Figure 4:
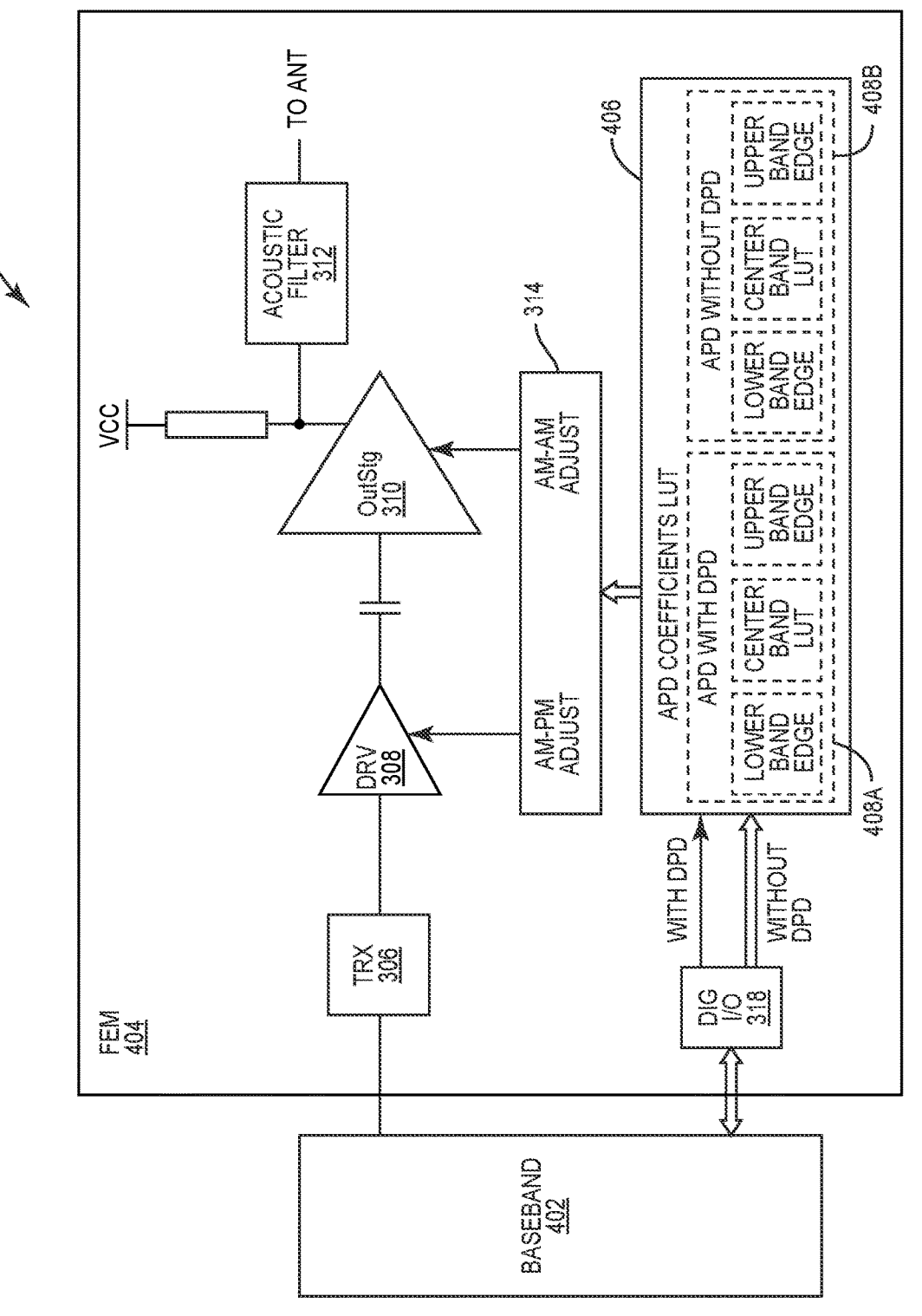
FIG. 4 is a block diagram of a transmitter with front-end APD to assist in creating a linear response from a power amplifier with or without digital predistortion in the BBP according to exemplary aspects of the present disclosure.

As alluded to above, there may be transmitters that do not have DPD in the BBP. Thus, as better illustrated in FIG. 4, a transmitter 400 may include a BBP 402 that provides no DPD. To provide the most options for design, the FEM 404 may include a LUT 406 with two sets 408A, 408B of APD coefficients. A first set 408A assumes that there will be DPD, and a second set 408B assumes that there will be no DPD. The selection of which set 408A, 408B is used may be indicated during manufacture (e.g., with an effuse, software programming, or the like). The coefficients are provided to elements of the FEM 404.

Figure 5:
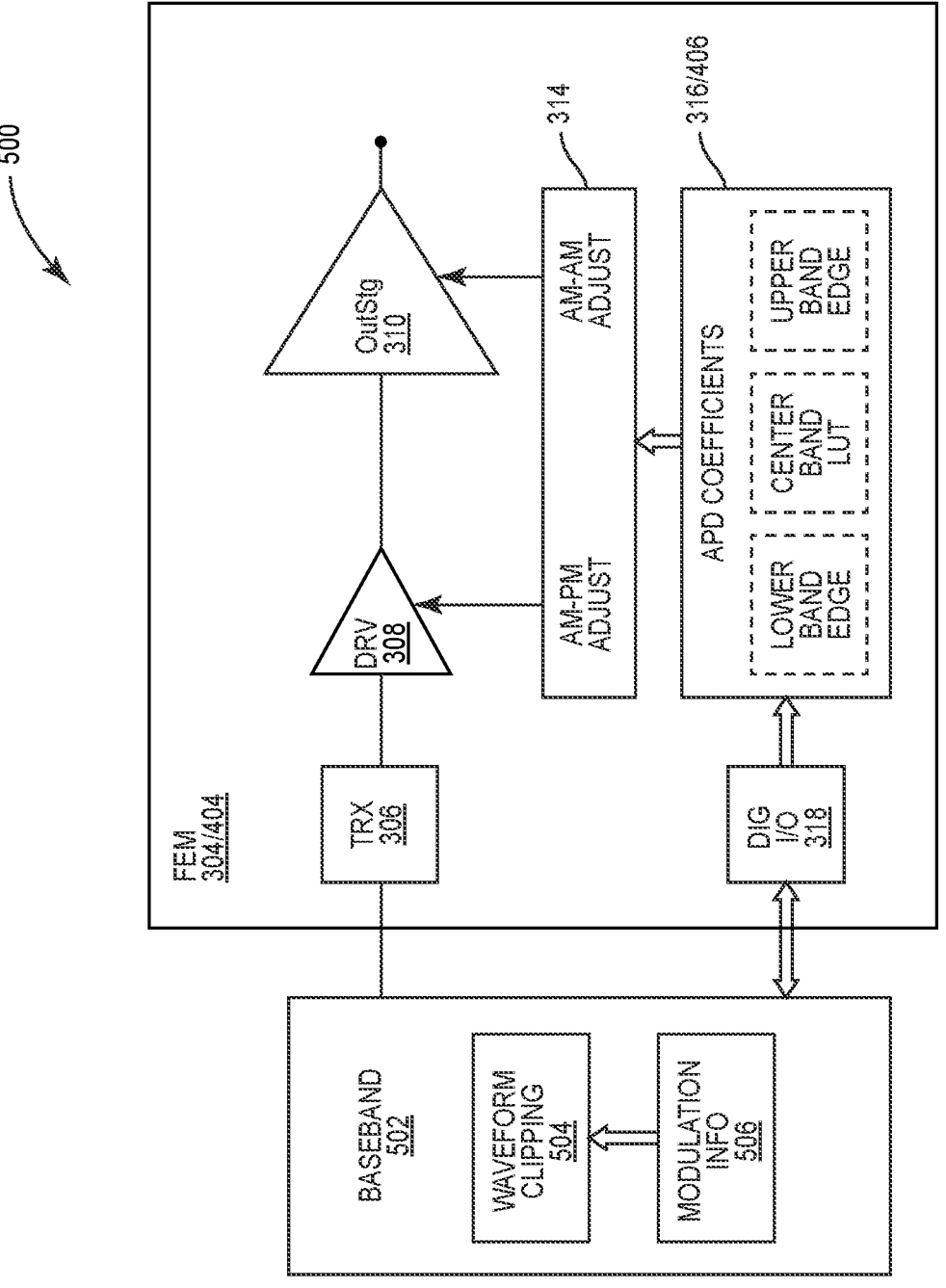
FIG. 5 is a block diagram of a transmitter that includes waveform clipping in the BBP to assist in creating a linear response from a power amplifier according to exemplary aspects of the present disclosure.

It should be appreciated that the linearity curve dispersion over a wide frequency range may grow as peak power is approached. That is, the difference in gain response at a given frequency may be relatively small at moderate power levels but may be relatively large at high or peak power conditions. In the case of 5G communications using high-order modulation (e.g., 256 quadrature amplitude modulation (256QAM)), the signal is not likely to remain at peak power for any significant duration, and the linearity of the power amplifier at such peaks is less important than predictable characteristics. As such, clipping the waveform around peak power will not result in significant overall linearity degradation. Accordingly, baseband waveform clipping may help reduce the impact of the linearity curve variation over a wide band. FIG. 5 provides a block diagram of a transmitter 500 having a BBP 502 with a waveform clipping circuit 504 that clips waveforms based on modulation information 506.

Figure 6:
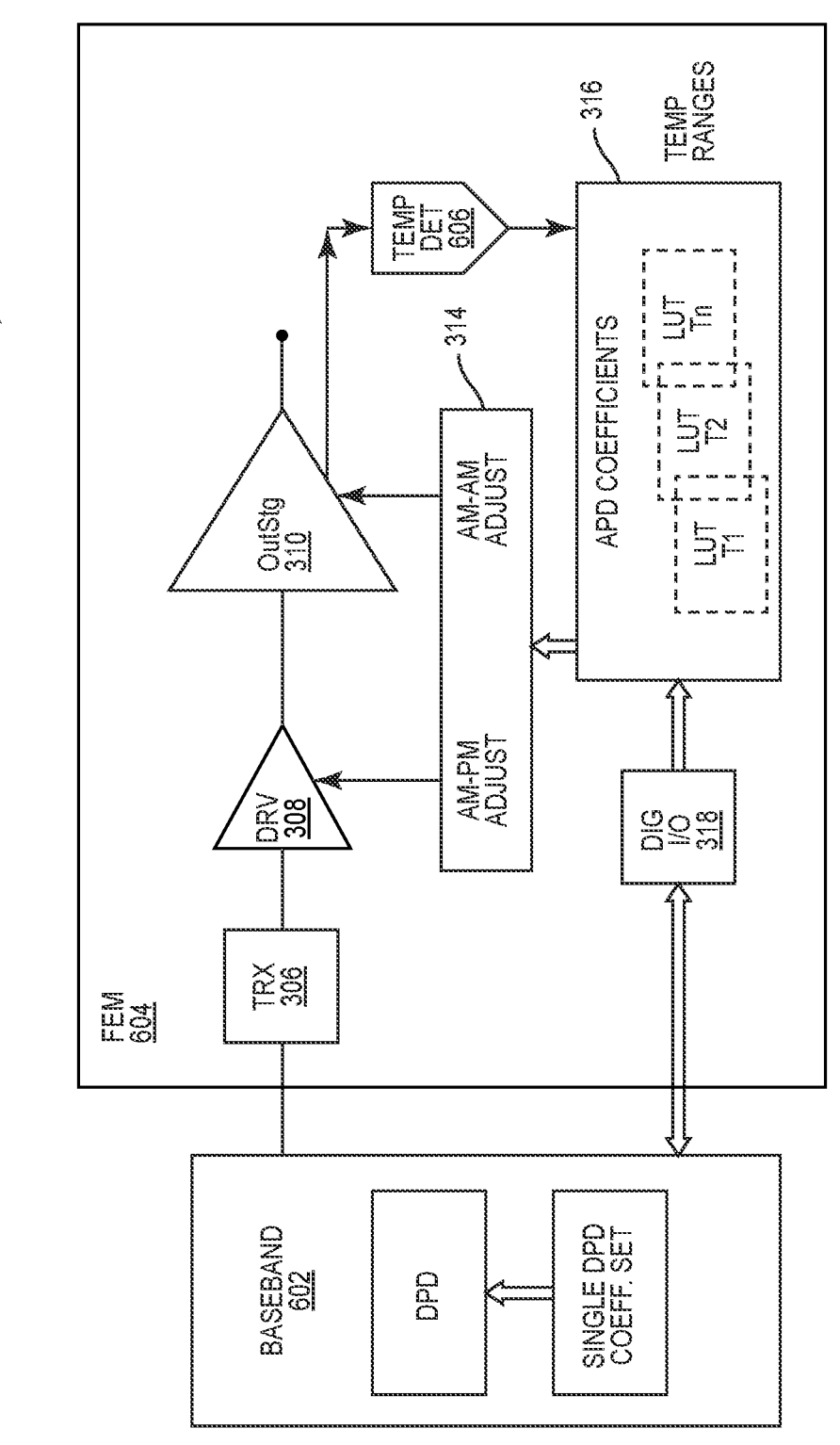
FIG. 6 is a block diagram of a transmitter that includes a temperature sensor in the front end to assist in selecting appropriate APD values according to exemplary aspects of the present disclosure.

In addition to just addressing changes in operation based on frequency, it is also possible to adjust operation to address other conditions such as environmental conditions and particularly temperature. In this regard, FIG. 6 illustrates a transmitter 600 with a BBP 602 and FEM 604. The BBP 602 may be substantially similar to the BBP 302. The FEM 604 is similar to the FEM 304 or 404 but also includes a temperature sensor 606 that communicates with the APD circuitry 314 and may be used to select specific APD coefficients within the LUT 316 that are indexed not only based on frequency but also on temperature. Making this adjustment through APD in the FEM 604 continues to reduce the burden on the BBP 602 for many different DPD coefficients but may also avoid a possible need to communicate the temperature information from the FEM 604 to the BBP 602. Note that other sorts of environmental sensors may be used to measure some environmental parameters as needed or desired.

As a note about the LUT 316, it should be appreciated that since the linearity curve of the power amplifier over many environmental parameters is relatively monotonic and involves shifts in the AM-AM and AM-PM curves, it may be sufficient to represent the more complex coefficient sets by offsets (i.e., a base set of coefficients is then modified by an offset determined by an environmental factor).

Figure 7:
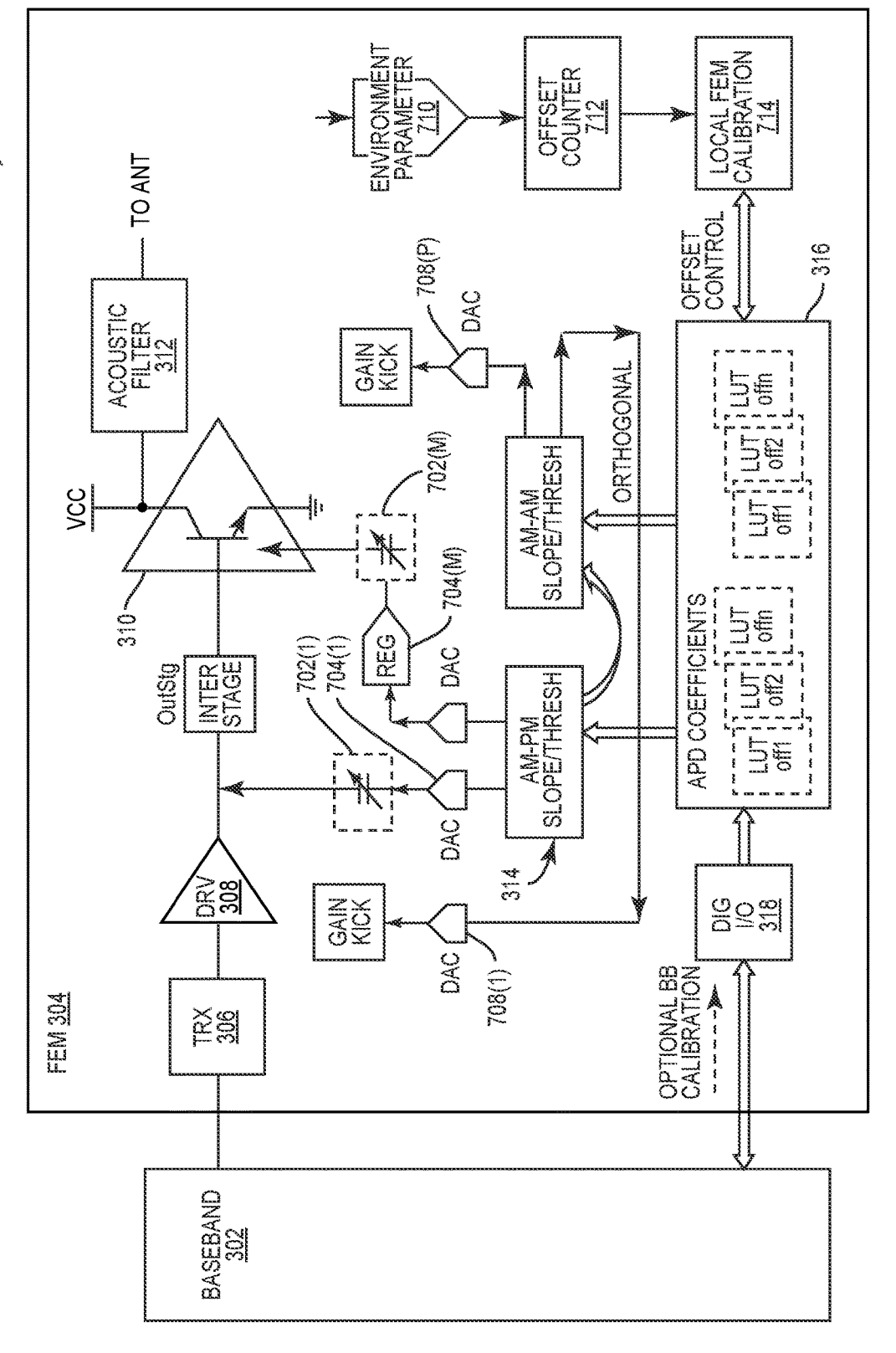
FIG. 7 is a hybrid block and circuit diagram showing additional details about how APD may be implemented in a front end according to exemplary aspects of the present disclosure.
Figure 8:
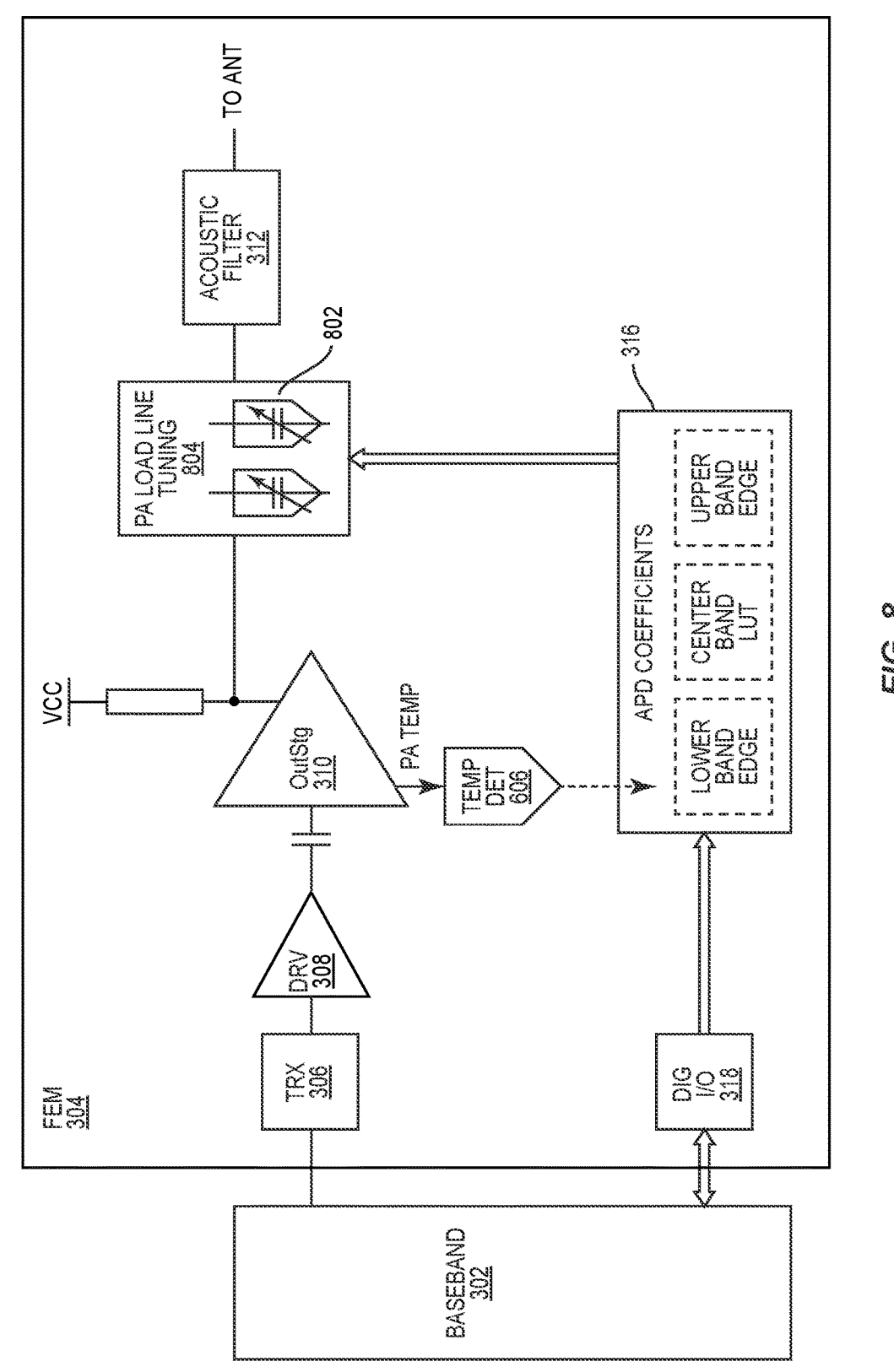
FIG. 8 is a block diagram showing an alternative way to implement APD in the front end according to exemplary aspects of the present disclosure.

The above discussion has been relatively generic about how the APD may be implemented by the APD circuitry 314. FIGS. 7 and 8 provide additional details on two ways the APD circuitry 314 may work. Specifically, with reference to FIG. 7, a transmitter 700 may use varactors 702(1)-702(M) controlled by digital to analog converters (DACs) 704(1)-704(M) and/or gain kicker circuits 706(1)-706(P) controlled by DACS 708(1)-708(P) to make the APD adjustments to the driver amplifier 308 or the output stage amplifier 310. AM-AM correction and AM-PM correction may be made at both the driver amplifier 308 and the output stage amplifier 310. As noted above, the LUT 316 may store offsets to adjust for environmental factors measured by the environmental sensor 710. The offset may be dictated by an offset counter 712 and work with a local FEM calibration circuit 714.

Instead of adjusting the amplifiers 308, 310, the adjustments may be made in the load line as illustrated by transmitter 800 in FIG. 8. Specifically, the APD circuitry 314 adjusts variable capacitors 802 in the load line 804.

Figure 9:
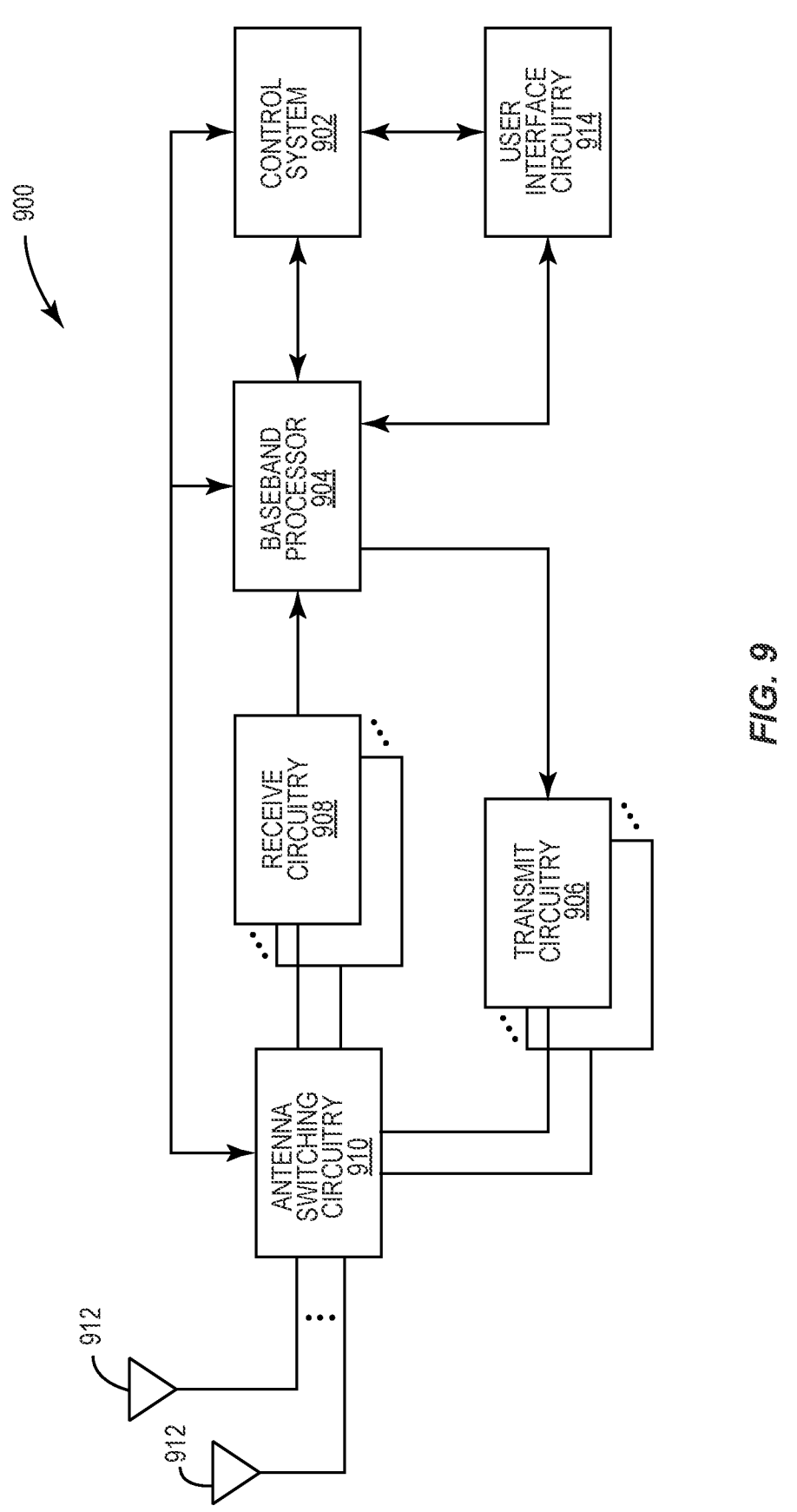
FIG. 9 is a block diagram of a mobile terminal, which may include the transmitters of FIGS. 3-8 according to the present disclosure.

With reference to FIG. 9, the concepts described above may be implemented in various types of user elements 900, such as mobile terminals, smart watches, tablets, computers, navigation devices, access points, and like wireless communication devices that support wireless communications, such as cellular, wireless local area network (WLAN), Bluetooth, and near field communications. The user elements 900 will generally include a control system 902, a baseband processor 904, transmit circuitry 906, receive circuitry 908, antenna switching circuitry 910, multiple antennas 912, and user interface circuitry 914. In a non-limiting example, the control system 902 can be a field-programmable gate array (FPGA) or an application-specific integrated circuit (ASIC), as an example. In this regard, the control system 902 can include at least a microprocessor(s), an embedded memory circuit(s), and a communication bus interface(s). The receive circuitry 908 receives radio frequency signals via the antennas 912 and through the antenna switching circuitry 910 from one or more base stations. A low noise amplifier and a filter of the receive circuitry 908 cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 904 processes the digitized received signal to extract the information or data bits conveyed in the received signal. This processing typically comprises demodulation, decoding, and error correction operations. The baseband processor 904 is generally implemented in one or more digital signal processors (DSPs) and ASICs.

For transmission, the baseband processor 904 receives digitized data, which may represent voice, data, or control information, from the control system 902, which it encodes for transmission. The encoded data is output to the transmit circuitry 906, where a digital-to-analog converter(s) (DAC) converts the digitally encoded data into an analog signal, and a modulator modulates the analog signal onto a carrier signal that is at a desired transmit frequency or frequencies. A power amplifier will amplify the modulated carrier signal to a level appropriate for transmission and deliver the modulated carrier signal to the antennas 912 through the antenna switching circuitry 910 to the antennas 912. The multiple antennas 912 and the replicated transmit and receive circuitries 906, 908 may provide spatial diversity. Modulation and processing details will be understood by those skilled in the art.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A front-end module (FEM) comprising:
   a power amplifier configured to receive and amplify a signal;
   a memory comprising a look-up table (LUT) comprising sub-band analog predistortion (APD) coefficients; and
   an APD circuit coupled to the power amplifier and configured to adjust the signal to compensate for distortion in the signal based on the sub-band APD coefficients in the memory.

2. The FEM of claim 1, wherein the APD circuit comprises amplitude modulation-amplitude modulation (AM-AM) correction for the signal.

3. The FEM of claim 1, wherein the APD circuit comprises amplitude modulation-phase modulation (AM-PM) correction for the signal.

4. The FEM of claim 1, wherein the power amplifier comprises a driver amplifier and an output amplifier.

5. The FEM of claim 1, wherein the LUT comprises a first set of APD coefficients for use when the signal has digital predistortion (DPD) applied before arrival at the FEM and a second set of APD coefficients for use when the signal does not have DPD applied before arrival at the FEM.

6. The FEM of claim 1, further comprising a temperature sensor thermally coupled to the power amplifier and configured to send a temperature signal to the APD circuit and wherein the LUT comprises different sub-band APD coefficients for different temperatures.

7. The FEM of claim 1, further comprising an environmental sensor configured to send an environmental signal to the APD circuit and where the LUT comprises different sub-band APD coefficients for different environmental conditions.

8. The FEM of claim 1, wherein the APD circuit comprises at least one digital-to-analog converter (DAC) coupled to a variable capacitor.

9. The FEM of claim 1, wherein the APD circuit comprises at least one load line tuning variable capacitor.

10. A transmitter comprising:
    a baseband processor (BBP); and
    a front-end module (FEM) coupled to the BBP and comprising:
       a power amplifier configured to receive and amplify a signal received from the BBP;
       a memory comprising a look-up table (LUT) comprising sub-band analog predistortion (APD) coefficients; and
       an APD circuit coupled to the power amplifier and configured to adjust the signal to compensate for distortion in the signal based on the sub-band APD coefficients in the memory.

11. The transmitter of claim 10, wherein the APD circuit comprises amplitude modulation-amplitude modulation (AM-AM) correction for the signal.

12. The transmitter of claim 10, wherein the APD circuit comprises amplitude modulation-phase modulation (AM-PM) correction for the signal.

13. The transmitter of claim 10, wherein the power amplifier comprises a driver amplifier and an output amplifier.

14. The transmitter of claim 10, wherein the BBP comprises a digital predistortion (DPD) circuit and the DPD circuit is configured to apply DPD to the signal before sending the signal to the FEM.

15. The transmitter of claim 10, wherein the LUT comprises a first set of APD coefficients for use when the signal has digital predistortion (DPD) applied before arrival at the FEM and a second set of APD coefficients for use when the signal does not have DPD applied before arrival at the FEM.

16. The transmitter of claim 10, further comprising a temperature sensor thermally coupled to the power amplifier and configured to send a temperature signal to the APD circuit and wherein the LUT comprises different sub-band APD coefficients for different temperatures.

17. The transmitter of claim 10, further comprising an environmental sensor configured to send an environmental signal to the APD circuit and where the LUT comprises different sub-band APD coefficients for different environmental conditions.

18. The transmitter of claim 10, wherein the APD circuit comprises at least one digital-to-analog converter (DAC) coupled to a variable capacitor.

19. The transmitter of claim 10, wherein the APD circuit comprises at least one load line tuning variable capacitor.

* * * * *